(12) United States Patent
Chen

(10) Patent No.: US 7,043,513 B2
(45) Date of Patent: May 9, 2006

(54) CLOCK BALANCED SEGMENTATION DIGITAL FILTER PROVIDED WITH OPTIMUN AREA OF DATA PATH

(75) Inventor: Ruey-Feng Chen, Hsinchu (TW)

(73) Assignee: Terax Communication Technologies, Inc., Hsinchu (TW)

(*) Notice: Subject to any disclaimer, the term of this patent is extended or adjusted under 35 U.S.C. 154(b) by 653 days.

(21) Appl. No.: 10/215,011

(22) Filed: Aug. 9, 2002

(65) Prior Publication Data

US 2004/0030735 A1    Feb. 12, 2004

(51) Int. Cl.
*G06F 17/10*    (2006.01)
(52) U.S. Cl. ..................................................... 708/319
(58) Field of Classification Search ................. 708/319
See application file for complete search history.

(56) References Cited

U.S. PATENT DOCUMENTS 4,615,026 A * 9/1986 Schiff .......................... 708/319
5,461,582 A * 10/1995 Peng et al. .................. 708/319
5,566,101 A * 10/1996 Kodra ......................... 708/319

* cited by examiner

*Primary Examiner*—D. H. Malzahn
(74) *Attorney, Agent, or Firm*—Rosenberg, Klein & Lee

(57) ABSTRACT

The present invention generally relates to provide a clock balanced segmentation digital filter, which is provided with an optimum area of a data path. The digital filter includes a controlling unit, which is connecting with a register, a multiplexer unit, and an arithmetic and logic unit. The present invention utilizes the controlling unit to initialize the filter parameter stored in the register and to segment the whole logic operation procedure to a plurality of operation steps and to arrange the operation procedure. The multiplexer unit is connecting with the register and the arithmetic and logic unit. The multiplexer unit controlled by the controlling unit is choosing the require parameter and data to output into the arithmetic and logic unit to perform the operation. The operation result is stored in the register for using as the following operation parameter. The present is provided with advantages of scaling down the area of logic circuit, low power consumption and rapid operation.

1 Claim, 2 Drawing Sheets

CLOCK BALANCED SEGMENTATION DIGITAL FILTER PROVIDED WITH OPTIMUN AREA OF DATA PATH

BACKGROUND OF THE INVENTION

1. Field of the Invention

The present invention generally relates to a filter, and more particularly relates to a clock balanced segmentation digital filter, which is provided with a simple circuit design and a small area.

2. Description of the Prior Art

Currently, with the improvement of the digital technology and highly application of the integrated circuits, using the digital technology to treatment the signal is become a commonly used method. The procedure of the conventional digital signal treatment includes utilizing an analog/digital converter (A/D converter) to convert the analog signal to the digital signal representation. Then, the digital signal is perform an appropriate treatment and the obtained result is returned to an analog output signal via the analog/digital converter (A/D converter). Hence, the key of the digital signal treatment is to use the digital filter selectively treating the signal.

In general, the main function of the common filter is to make the signal, after the complex operation formula designed therein, to enhance the amplitude of vibration or the frequency characteristic of the required signal at a specified frequency range so as to obtain the output signal with a high quality and an anti-miscellaneous ability at the specified frequency to reduce the unwanted amplitude of vibration or the unwanted frequency characteristic. The circuit operation design of the prior filter, because each operation formula must require a operation unit to perform the operation, so the filter, which is required complex operation, must utilize a plurality of adders, subtracters, multipliers, and operation unit to compose the required operation circuit for the filter. Hence, the filter requires hardware with complex design and a larger area for arranging the hardware. Presently, the prior filter cannot match the microminiaturized require of the filter. Besides, owing to each operation unit have a delay time in the operation, the prior filter used such adders, subtracters, multipliers therein will cause the require of a longer delay time of the operation of the whole filter, so the filter can not achieve the rapid require of wave filtering.

Obviously, the main spirit of the present invention is to provide digital filter with a small area and rapid operation, and then some disadvantages of well-known technology are overcome.

SUMMARY OF THE INVENTION

The primary object of the invention is to provide a digital filter, which is utilizing the technology of the sharing resource to compress the complex operation procedure of the signal treatment of the digital filter so as the present invention can only require one adder-subtracter and one shifter to achieve the equal effect and provide with the advantages of scaling down the area of logic circuit, low power consumption and rapid operation.

Another object of the invention is to provide a simple designed digital filter to properly segment the length of the logic operation to effectively enhance the speed of the clock so as the digital filter can achieve the advantage of rapid operation.

In order to achieve previous objects, the present invention provides a digital filter. The clock balanced segmentation digital filter includes the following elements. An arithmetic and logic unit is composing of an adder-subtracter and a shifter. A register is used for storing the filter parameter and operation data, which are required for the operation. A controlling unit is connecting with the register and a multiplexer unit so as the multiplexer unit controlled by the controlling unit is choosing the require parameter and data to output into the arithmetic and logic unit to perform the operation and then the operation result is stored in the register for using as the following operation parameter.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
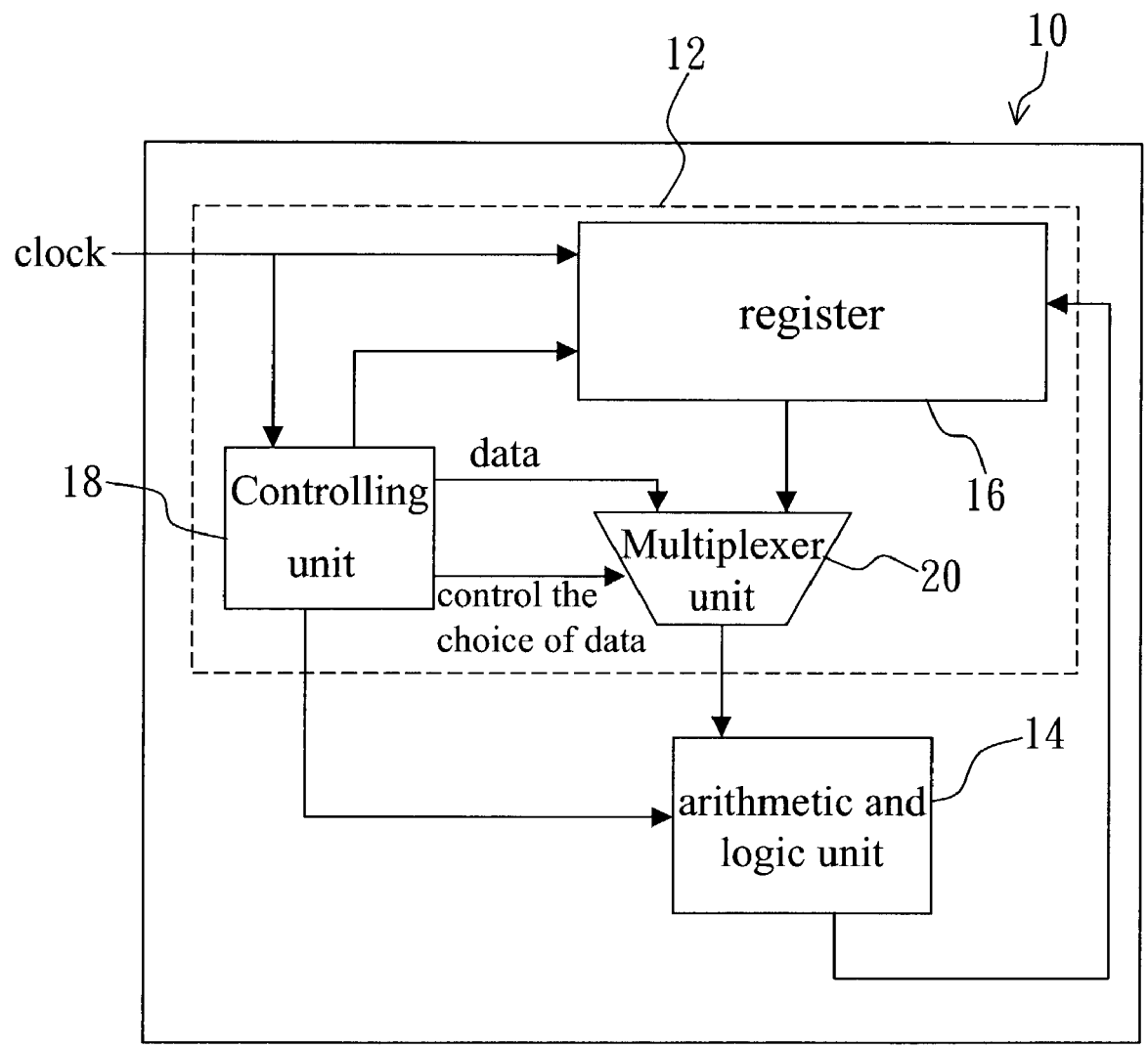
FIG. 1 is a schematic representation of a block diagram of the digital filter, in accordance with the present invention.

Referring to the FIG. 1 a digital filter 10 includes an infinite impulse response (IIR) controlling device 12 and an arithmetic and logic unit 14. Wherein, the IIR controlling device 12 comprises a register 16, a controlling unit 18 and a multiplexer unit (MUX) 20. The register 16 is connecting with the controlling unit 18 so as to utilize the register 16 storing the required filter parameter in the operation and receiving the operation data from the controlling unit 18. In the beginning of the operation, the filter parameter stored in the register 16 is initialized by the controlling unit 18. However, the multiplexer unit (MUX) 20 is connected to the controlling unit 18, the register 16, and the arithmetic and logic unit 14, so the multiplexer unit (MUX) 20 is according to the control of the controlling unit 18 to choosing the required filter parameter and the operation data in the operation to output into the arithmetic and logic unit 14. At the same time, the arithmetic and logic unit 14 would directly receive the data from the controlling unit 18 to match the filter parameter and to perform the operation. The new obtained parameter from the operation is stored into the register 16 to use for the operation parameter in the following use.

Figure 2:
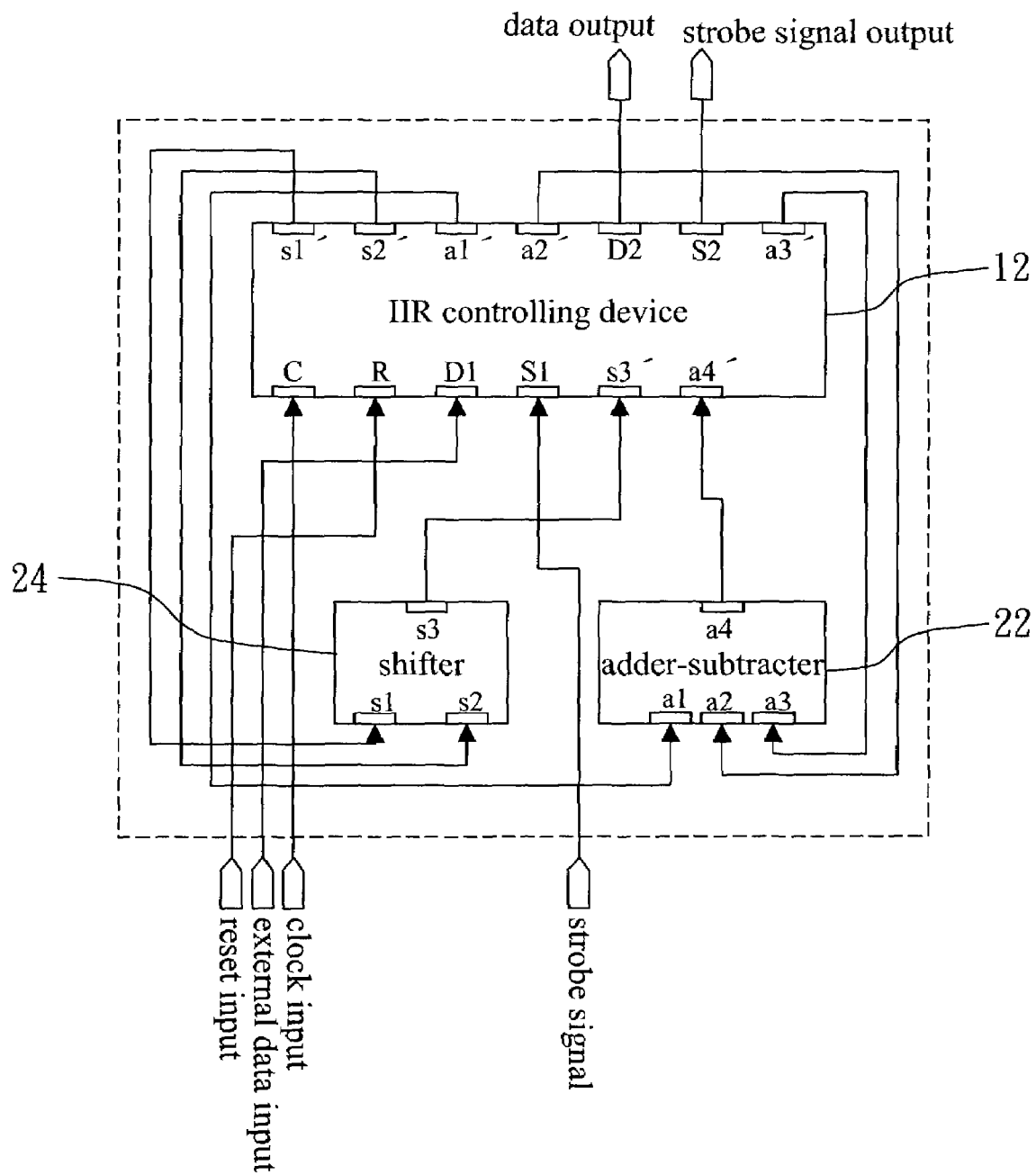
FIG. 2 is a schematic representation of the relation of line configuration of the digital filter, in accordance with the present invention.

Referring to the FIG. 2, the arithmetic and logic unit 14 mentioned above is composed of an adder-subtracter 22 and a shifter 24. Wherein, the adder-subtracter 22 is provided with three input ends and one output end, respectively shown as a1, a2, a3, a4. The input end a1 and the input end a2 are connected with the multiplexer unit (MUX) 20. The input end a3 is connected with the controlling unit 18 and the output end a4 is connected with the register 16. In the present invention, the input end a1 and the input end a2 are respectively receiving two numerals, such as the filter parameter or data inputted from the multiplexer unit (MUX) 20. The input end a3 is receiving the performing signal from the controlling unit 18 to perform adding or subtracting to those two numerals. After adding or subtracting those two numerals via the adder-subtracter 22, the output end a4 of the adder-subtracter 22 is outputting a numeral (a new operation parameter) into the register 16 of the IIR controlling device 12 and to be stored therein. In the same reason, the shifter 24 is arranged two input ends connecting with the multiplexer unit (MUX) 20 and one output end connecting with the register 16, respectively shown as s1, s2, s3. In the present invention, a numeral is inputted into the input end s1 and the required bit amount to shift the numeral is inputted into the input end s2 for the numeral inputted via the output end s3 after the operation of the shifter 24 and stored in the register 16 for the following operation. Besides, in the whole IIR controlling device 12, such as shown in the FIG. 2, except four circuit ends a1', a2', a3', and a4' used for the internal output end and input end of the adder-subtracter mentioned above, and except three circuit ends s1', s2', s3' used for the internal output end and input end of the shifter, there are another four circuit ends respectively for reset input, clock input, external filtering-required data input, the storbe signal input, such as external input ends are respectively shown as R, C, D1, and S1. Besides, there are another two circuit ends, such shown as D2 and S2, are respectively used for inputting data after the treatment of the filter and outputting the storbe signal.

The present invention utilizes the controlling unit 18 mentioned above to control the internal operation procedure of the whole digital filter. When the digital filter is performing the initializing step, the controlling unit 18 only provides few necessary parameters to store into the register 16 and appropriately segment the length of the logic operation. The logic operation is speared into few simple operation steps (such as numeral adding, numeral subtracting, and numeral shifting) to help the operation of the adder-subtracter 22 and the shifter 24 and arrange the order of each operation step at the same time. After, the multiplexer unit (MUX) 20 controlled by the controlling unit 18 is choosing two operated-required numerals from the register 16 and then transferring into the arithmetic and logic unit 14 to perform the operation to produce a new parameter and then storing in the register 16. Repeating and repeating the above steps, there are more and more parameters stored in the register 16 until the controlling unit 18 finishing the whole logic operation.

To sum up the forgoing, the present invention merely utilizes one adder-subtracter 22 and one shifter 24 to compose of the arithmetic and logic unit 14 repeating performing numeral operations. The present invention is utilizing the technology of the sharing resource to compress the complex operation procedure of the signal treatment of the digital filter so as the present invention only require one adder-subtracter and one shifter to achieve the equal effect and provide with the advantages of scaling down the area of logic circuit, low power consumption and match the micro-miniaturized require of the filter. Furthermore, the present invention properly segments the length of the logic operation to effectively enhance the speed of the clock so as the digital filter can achieve the advantage of rapid operation.

Of course, it is to be understood that the invention described herein need not be limited to these disclosed embodiments. Various modification and similar changes are still possible within the spirit of this invention. In this way, all such variations and modifications are included within the intended scope of the invention and the scope of this invention should be defined by the appended claims.

What is claimed is:

1. A clock balanced segmentation digital filter which is provided with an optimum area of a data path, said digital filter comprising:

a register for storing a plurality of operational parameters;

a single multiplexer unit having a first input coupled to an output of said register;

a single arithmetic and logic unit having an input coupled to an output of said multiplexer unit and an output coupled to said register for storing a current arithmetic operation result thereof in said register as a new operational parameter; and, a controlling unit coupled to said register and storing an initial filter parameter therein, said controlling unit being coupled to said multiplexer unit and said arithmetic and logic unit for segmenting a required operation procedure into a plurality of sequential operation steps;

wherein said arithmetic logic unit includes a shifter and an adder-subtracter, said shifter having one input coupled to said output of said multiplexer unit for receiving a data signal therefrom and another input coupled to an output of said controlling unit for receiving a bit shift control signal for controlling the number of bits of the data signal that are to be shifted, said shifter having an output coupled to said register for storing said bit shifted data signal therein, said adder-subtracter having a pair of first inputs coupled to said multiplexer unit for receiving data including said initial filter parameter to be combined by one of an addition or subtraction operation and a second input coupled to said controlling unit for receiving a control signal therefrom for controlling addition and subtraction operations thereof, said adder-subtracter having an output coupled to said register for storing said current arithmetic operation result.

* * * * *